United States Patent
Takikawa et al.

(10) Patent No.: US 12,154,764 B2
(45) Date of Patent: Nov. 26, 2024

(54) GAS SUPPLY DETERMINATION METHOD AND PLASMA GENERATOR

(71) Applicant: FUJI CORPORATION, Chiryu (JP)

(72) Inventors: Shinji Takikawa, Anjo (JP); Takahiro Jindo, Anjo (JP)

(73) Assignee: FUJI CORPORATION, Chiryu (JP)

( * ) Notice: Subject to any disclaimer, the term of this patent is extended or adjusted under 35 U.S.C. 154(b) by 970 days.

(21) Appl. No.: 17/265,424

(22) PCT Filed: Aug. 28, 2018

(86) PCT No.: PCT/JP2018/031693
§ 371 (c)(1),
(2) Date: Feb. 2, 2021

(87) PCT Pub. No.: WO2020/044427
PCT Pub. Date: Mar. 5, 2020

(65) Prior Publication Data
US 2021/0313155 A1 Oct. 7, 2021

(51) Int. Cl.
*H01J 37/32* (2006.01)

(52) U.S. Cl.
CPC .... *H01J 37/32449* (2013.01); *H01J 37/3244* (2013.01); *H01J 37/32935* (2013.01)

(58) Field of Classification Search
None
See application file for complete search history.

(56) References Cited

U.S. PATENT DOCUMENTS

| | | | |
|---|---|---|---|
| 2004/0094206 A1* | 5/2004 | Ishida | G05D 7/0658 137/487.5 |
| 2005/0173381 A1 | 8/2005 | Delzenne | |
| 2006/0283390 A1* | 12/2006 | Ishida | G05D 7/0658 118/715 |

(Continued)

FOREIGN PATENT DOCUMENTS

| | | |
|---|---|---|
| CN | 107709953 A | 2/2018 |
| JP | 10-34343 A | 2/1998 |
| JP | 2014-36024 A | 2/2014 |

OTHER PUBLICATIONS

International Search Report issued on Nov. 20, 2018 in PCT/JP2018/031693 filed on Aug. 28, 2018 citing documents AA and AO therein, 2 pages.

*Primary Examiner* — Thor S Campbell
(74) *Attorney, Agent, or Firm* — Oblon, McClelland, Maier & Neustadt, L.L.P.

(57) ABSTRACT

In a plasma generator having a first supply port and a second supply port, in which the plasma generator includes a first supply device for supplying a first gas from the first supply port, and a second supply device connected to the first supply device so as to supply a second gas from the second supply port, a gas supply determination method includes a first supply step of causing the first supply device to start supplying the first gas in a state where the second supply device stops supplying the second gas, a first measurement step of measuring a flow rate of the gas supplied to the first supply port after the first supply step, and a first notification step of notifying a supply state of the first gas in the first supply port in accordance with a flow rate measurement result of the first measurement step.

7 Claims, 7 Drawing Sheets

(56) References Cited

U.S. PATENT DOCUMENTS

2014/0041804 A1\* 2/2014 Nagatani ........... C23C 16/45561
                                                            73/195
2017/0001255 A1   1/2017 Winn
2018/0180509 A1   6/2018 Sawachi et al.
2019/0139796 A1\* 5/2019 Lee ................... H01L 21/67017

\* cited by examiner

| SUPPLY GAS CHECK | | NOW INITIALIZING | | Cancel |
|---|---|---|---|---|
| ITEMS | SET VALUES | CURRENT VALUES | DETERMINATION | |
| MAIN(GAS2) | 0.60 | 0.60 | OK | |
| HEATER(GAS) | 30.0 | 30.0 | OK | |
| MAIN(GAS1) | 20.0 | 00.0 | | |
| SUB1 | 20.0 | 00.0 | | |
| SUB2 | 20.0 | 00.0 | | |

Fig. 7

| SUPPLY GAS CHECK | | NOW INITIALIZING | | Cancel |
|---|---|---|---|---|
| ITEMS | SET VALUES | CURRENT VALUES | DETERMINATION | |
| MAIN(GAS2) | 0.60 | 0.00 | OK | |
| HEATER(GAS) | 30.0 | 0.0 | OK | |
| MAIN(GAS1) | 20.0 | 00.0 | OK | |
| SUB1 | 20.0 | 00.0 | OK | |
| SUB2 | 20.0 | 00.0 | OK | |

Fig. 8

| SUPPLY GAS CHECK | | NOW INITIALIZING | | Cancel |
|---|---|---|---|---|
| ITEMS | SET VALUES | CURRENT VALUES | DETERMINATION | |
| MAIN(GAS1) | 20.0 | 20.0 | OK | |
| SUB1 | 20.0 | 20.0 | OK | |
| SUB2 | 20.0 | 20.0 | OK | |
| MAIN(GA2) | 0.00 | 0.00 | | |
| HEATER(GAS) | 00.0 | 00.0 | | |

Fig. 9

| PRESSURE CHECK | | NOW INITIALIZING | | Cancel |
|---|---|---|---|---|
| ITEMS | CURRENT VALUES | THRESHOLDS | DETERMINATION | |
| MAIN | 50.0 | 40.0~80.0 | OK | |
| SUB1 | 49.0 | 40.0~80.0 | OK | |
| SUB2 | 49.0 | 40.0~80.0 | OK | |
| HEATER | 65.0 | 50.0~80.0 | OK | |

GAS SUPPLY DETERMINATION METHOD AND PLASMA GENERATOR

TECHNICAL FIELD

The present disclosure relates to a gas supply determination method and a plasma generator for checking supply states of two types of gases.

BACKGROUND ART

In the conventional art, in a plasma generator, a step of checking supply states of two types of gases is performed. As the step of checking this supply gas, for example, a technique disclosed in Patent Literature 1 below has been proposed.

PATENT LITERATURE

Patent Literature 1: US Patent Application Publication No. 2005/0173381

BRIEF SUMMARY

Technical Problem

However, according to the technique disclosed in Patent Literature 1, it is difficult to check a supply state of a second gas supplied by a second supply device connected to a first supply device, in addition to a supply state of a first gas supplied by the first supply device.

Therefore, in view of the above-described point, an object of the present disclosure is to a technique which can check a supply state of a second gas supplied by a second supply device connected to a first supply device, in addition to checking a supply state of a first gas supplied by the first supply device, in a plasma generator.

Solution to Problem

The present specification discloses a gas supply determination method in a plasma generator having a first supply port and a second supply port, in which the plasma generator includes a first supply device for supplying a first gas from the first supply port, and a second supply device connected to the first supply device so as to supply a second gas from the second supply port; and a gas supply determination method including a first supply step of causing the first supply device to start supplying the first gas in a state where the second supply device stops supplying the second gas, a first measurement step of measuring a flow rate of the gas supplied to the first supply port after the first supply step, and a first notification step of notifying a supply state of the first gas in the first supply port in accordance with a flow rate measurement result of the first measurement step.

Advantageous Effects

According to the present disclosure, a gas supply determination method can check a supply state of a second gas supplied by a second supply device connected to a first supply device, in addition to checking a supply state of a first gas supplied by the first supply device, in a plasma generator.

DESCRIPTION OF EMBODIMENTS

Hereinafter, a plasma treatment machine of a representative embodiment of a plasma generator according to the present disclosure will be described in detail with reference to the drawings. In addition to the following embodiment, the present disclosure can be implemented in various aspects in which various modifications and improvements are made based on the knowledge of those skilled in the art.

Overall Configuration of Plasma Treatment Machine

Figure 1:
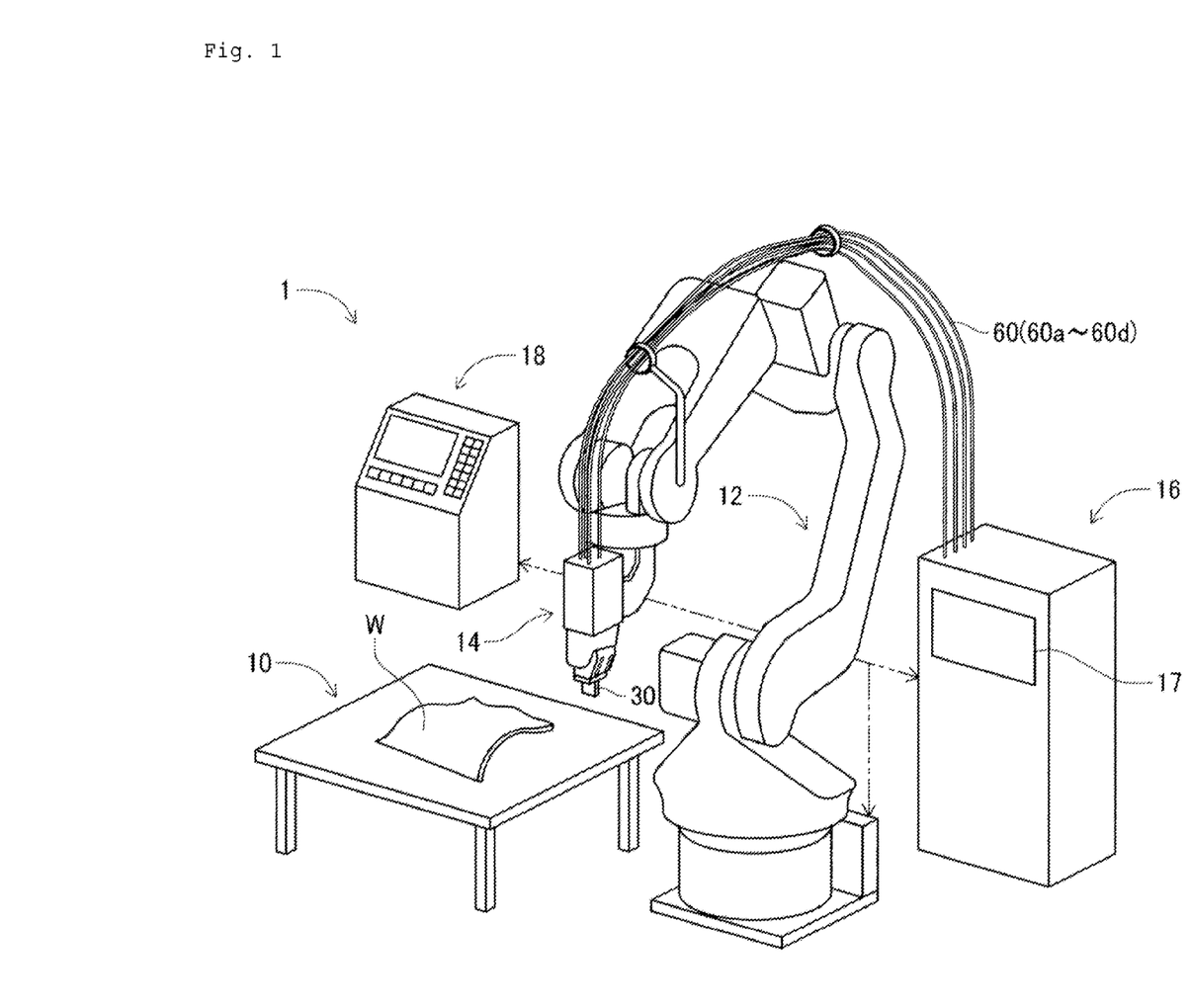
FIG. 1 is a perspective view illustrating an overall configuration of a plasma treatment machine of an embodiment.

As illustrated in FIG. 1, plasma treatment machine 1 of the present embodiment is configured to include table 10 on which workpiece W is placed, serial link type robot (also referred to as a multi-joint robot, hereinafter, simply abbreviated as a robot) 12 disposed near table 10, and plasma head 14 (hereinafter, simply referred to as head 14 in some cases) held by robot 12 so as to irradiate workpiece W with plasma-converted gas. Furthermore, plasma treatment machine 1 of the present embodiment is configured to include power source gas supply unit 16 which is a power source for head 14 and which is responsible for supplying the gas to head 14, and controller 18 (a computer is used as a main configuration element) serving as a control device for controlling plasma treatment machine 1. Incidentally, robot 12 functions as a head moving device for moving head 14 to irradiate workpiece W with the plasma-converted gas.

Power source gas supply unit 16 includes touch panel 17 in addition to a CPU, a ROM, and a RAM (not illustrated). Touch panel 17 displays various setting screens or operation states (for example, a check result of a gas supply state (to be described later)) with regard to power source gas supply unit 16, and operation information is input thereto by a user's touch on a screen.

Figure 2:
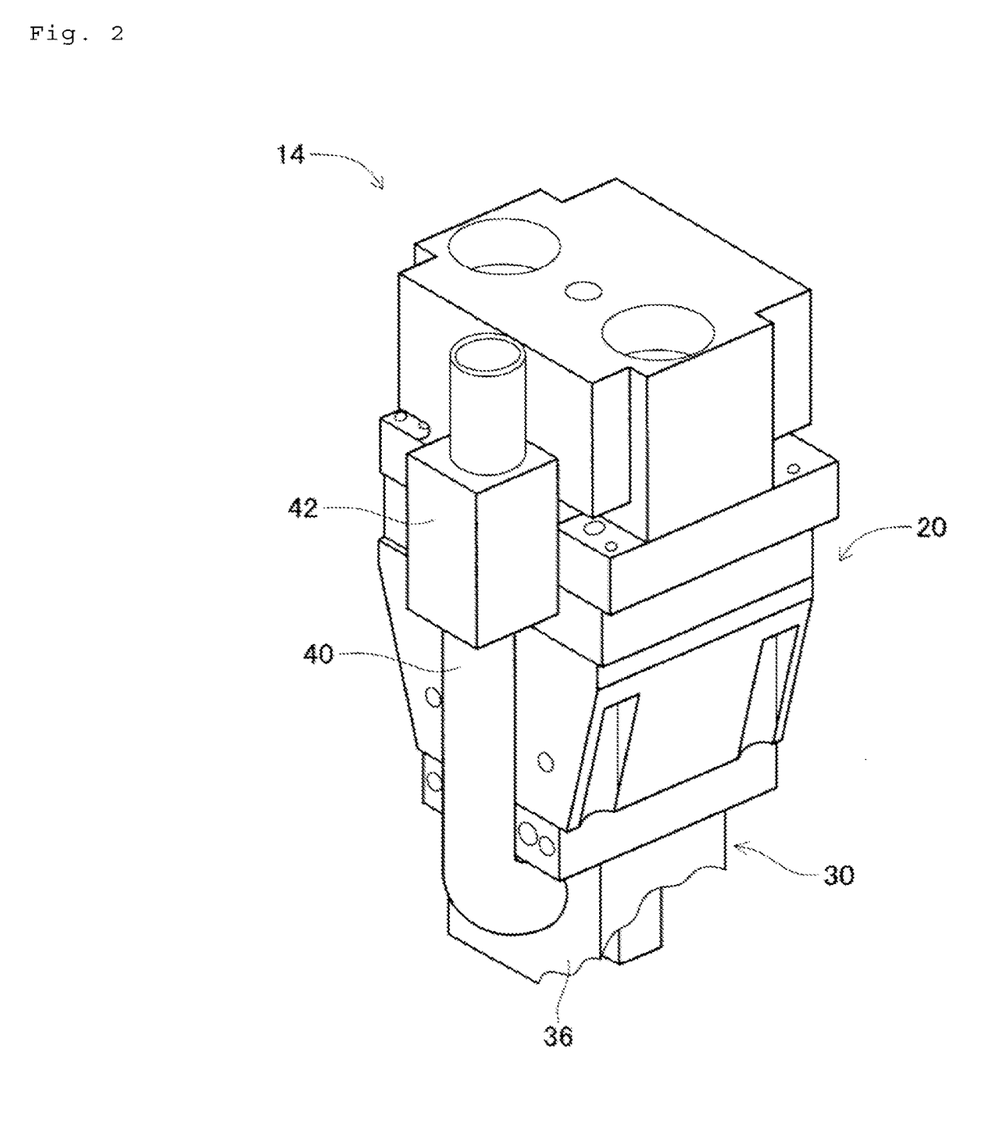
FIG. 2 is a perspective view illustrating a plasma head of the plasma treatment machine in FIG. 1 in a state where a cover is detached therefrom.
Figure 3:
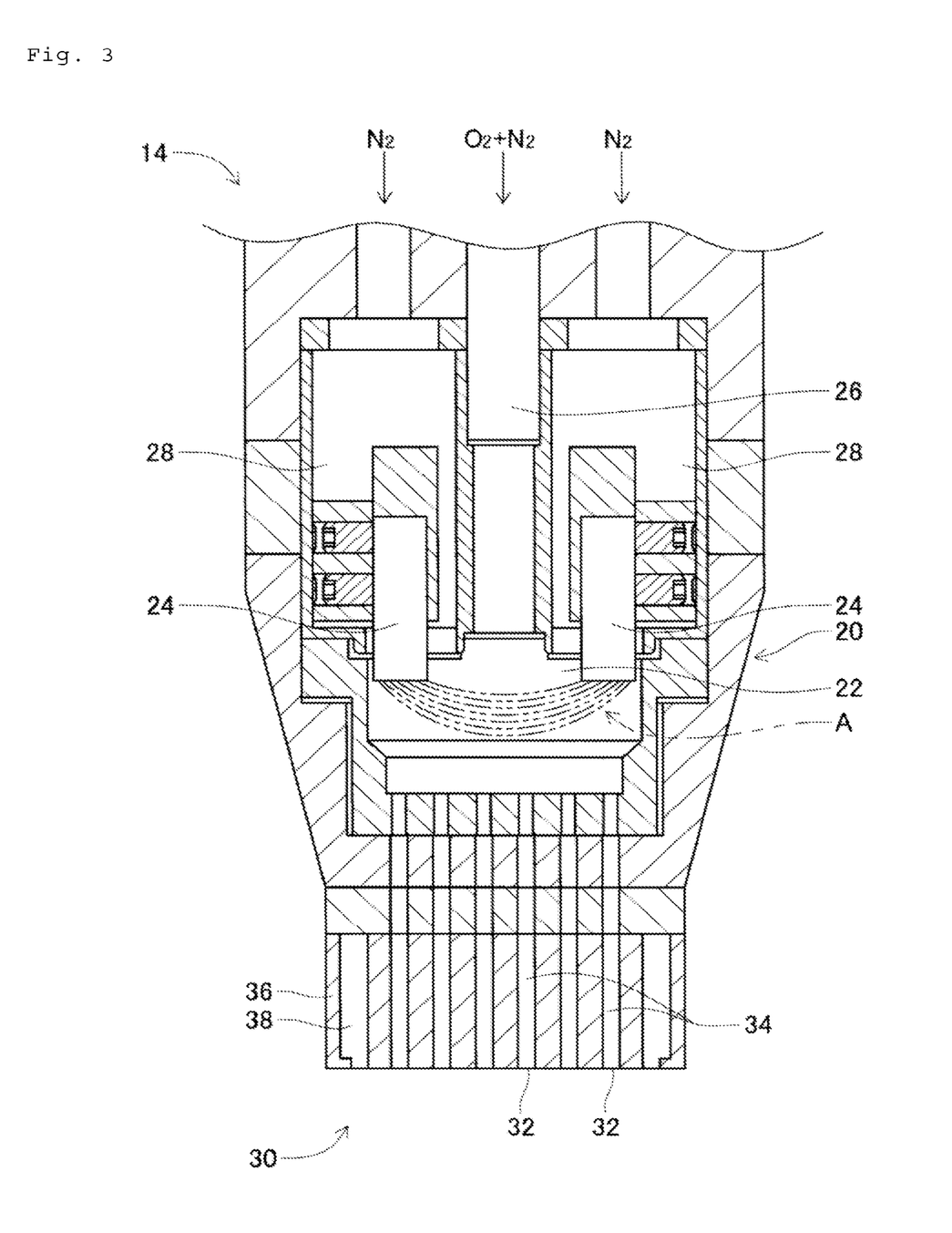
FIG. 3 is a sectional view of the plasma head in FIG. 2.

Referring to FIG. 2 which illustrates a state where a cover is detached, and FIG. 3 which is a sectional view, head 14 has housing 20 substantially made of ceramic, and reaction chamber 22 for generating the plasma-converted gas is formed inside housing 20. Then, a pair of electrodes 24 is held to protrude to reaction chamber 22. In addition, reaction gas flow path 26 for causing a reaction gas to flow into reaction chamber 22 from above and a pair of carrier gas flow paths 28 for causing a carrier gas to flow into reaction chamber 22 are formed inside housing 20. The reaction gas (source gas) is oxygen ($O_2$), but from reaction gas flow path 26, a mixed gas of oxygen and nitrogen ($N_2$) (for example, dry air (Air)) is caused to flow between electrodes 24 (hereinafter, the mixed gas will be referred to as the reaction gas for the sake of convenience, and the oxygen may be referred to as the source gas in some cases). The carrier gas is nitrogen, and is caused to flow from each carrier gas flow path 28 to surround each electrode 24. A lower part of head 14 is nozzle 30, and multiple discharge ports 32 are formed in nozzle 30 to be aligned in a row. Then, multiple discharge passages 34 are formed downward from reaction chamber 22 to be connected to each discharge port 32.

An AC voltage is applied between the pair of electrodes 24 by a power source section of power source gas supply unit 16. For example, as illustrated in FIG. 3, this application generates pseudo arc A between lower ends of the pair of electrodes 24 inside reaction chamber 22. When the reaction gas passes through pseudo arc A, the reaction gas is converted into plasma, and the plasma-converted gas which is the gas converted into plasma is discharged (ejected) from nozzle 30 together with the carrier gas.

Sleeve 36 is provided around nozzle 30 to surround nozzle 30. A heat gas serving as a shield gas (air is adopted in plasma treatment machine 1 of the present embodiment) is supplied to annular space 38 between sleeve 36 and nozzle 30 via supply pipe 40, and the heat gas is discharged along a flow of the plasma-converted gas to surround a periphery of the plasma-converted gas discharged from nozzle 30. As indicated by the name, the heat gas is configured so that those heated to ensure efficacy of the plasma-converted gas are discharged. Therefore, heater 42 for the heating is provided in the middle of supply pipe 40.

Power source gas supply unit 16 is configured to include a power source section and a gas supply section. Power source section has a power source for applying a voltage between the pair of electrodes 24 of head 14, the gas supply section functioning as a gas supply device supplies the reaction gas, the carrier gas, and the shield gas which are described above. Gas supply of the gas supply section will be described in detail below.

Gas Supply

Figure 4:
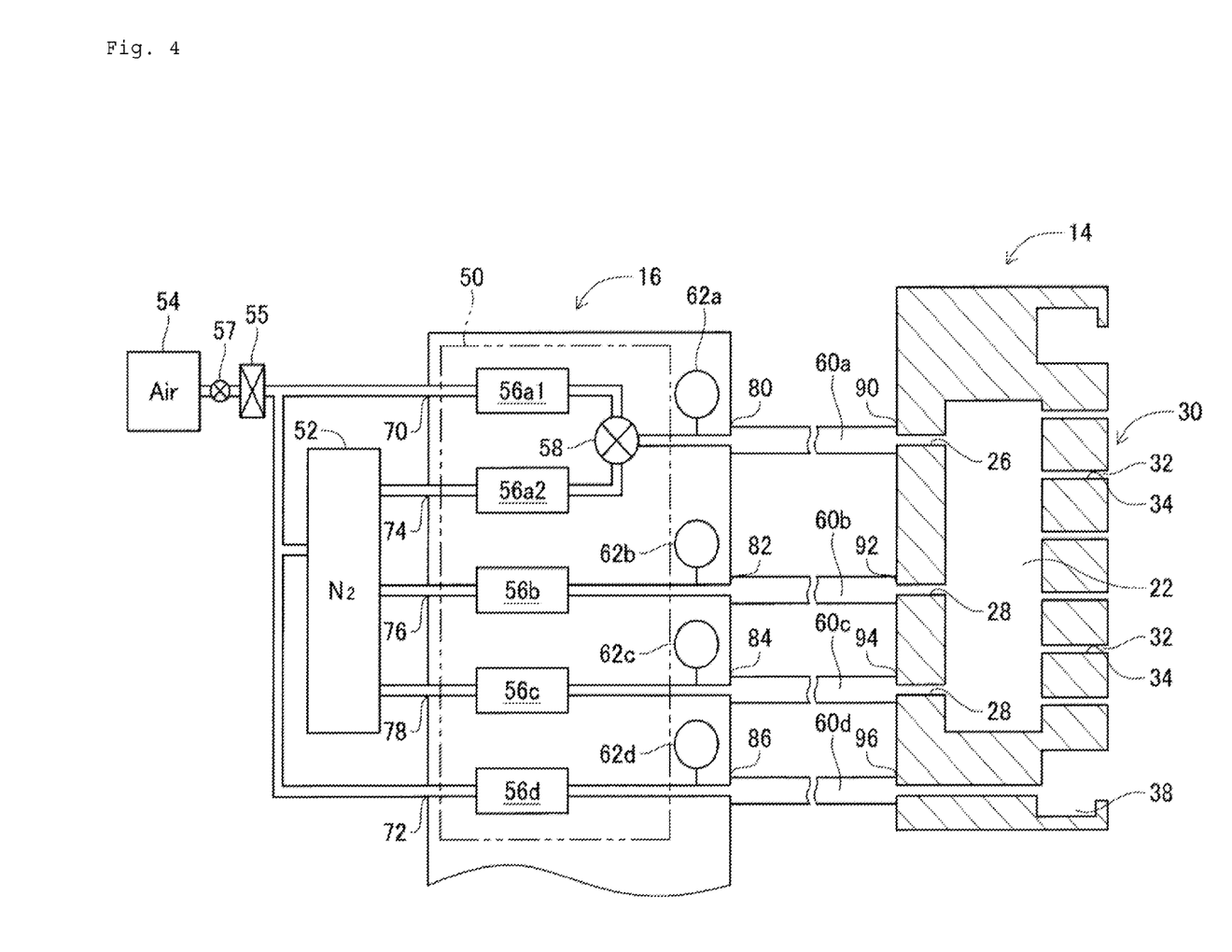
FIG. 4 is a schematic view for describing a configuration relating to gas supply to the plasma head in the plasma treatment machine in FIG. 1.

As illustrated in FIG. 4, a nitrogen gas ($N_2$) and air (Air) (for example, dry air) are respectively supplied to power source gas supply unit 16, in particular, gas supply section 50 of power source gas supply unit 16 from nitrogen gas generator 52 serving as a supply source of the nitrogen gas and compressor 54 serving as a supply source of the air. Incidentally, nitrogen gas generator 52 is connected to compressor 54 so that the nitrogen gas is separated from the air supplied from compressor 54, and dryer 55 is provided to remove moisture of the air supplied from compressor 54.

Main valve 57 is disposed between compressor 54 and dryer 55. In addition, when nitrogen gas generator 52 is not in an operation state, nitrogen gas generator 52 blocks a flow of the gas, and sets a gas flow rate to 0.

Gas supply section 50 has mass flow controllers 56 respectively serving as flow rate regulators corresponding to the air containing oxygen as a source gas forming the above-described reaction gas, the nitrogen gas configuring the reaction gas, the nitrogen gas as two systems of the carrier gas corresponding to a pair of carrier gas flow paths 28 of head 14, and the air forming the heat gas. For the sake of convenience, mass flow controllers 56 may be referred to as mass flow controllers 56a1, 56a2, 56b, 56c, and 56d when the five controllers need to be distinguished from each other. The air whose flow rate is adjusted by mass flow controller 56a1 and the nitrogen gas whose flow rate is adjusted by mass flow controller 56a2 are mixed with each other by mixer 58 to generate the reaction gas.

When mass flow controller 56 is not in an operation state, mass flow controller 56 blocks a flow of the gas, and sets the gas flow rate to 0.

The reaction gas, the two systems of the carrier gas, and the heat gas are respectively supplied to head 14 via four gas tubes 60 (refer to FIG. 1). Incidentally, hereinafter, gas tube 60 may be simply abbreviated as tube 60, and may be referred to as tubes 60a, 60b, 60c, and 60d, when the four tubes need to be distinguished from each other. The reaction gas and the two systems of the carrier gas which are supplied via tubes 60a, 60b, and 60c are mixed with each other in reaction chamber 22 inside head 14, and the mixed gas containing plasma-converted oxygen is discharged from nozzle 30. Pressure sensors 62 which are respectively pressure detectors are provided on mass flow controller 56 side of four tubes 60 inside power source gas supply unit 16, in order to detect each pressure of the gases passing through four tubes 60. In other words, pressure sensor 62 is provided between each tube 60 and gas supply section 50. Incidentally, pressure sensors 62 may be referred to as pressure sensors 62a, 62b, 62c, and 62d when the four sensors need to be distinguished from each other.

Compressor 54 supplies the air to mass flow controllers 56a1 and 56d inside gas supply section 50 via first air supply port 70 and second air supply port 72 which are provided in power source gas supply unit 16. In this manner, mass flow controllers 56a1 and 56d can adjust the flow rate while measuring the flow rate of the air supplied from first air supply port 70 and second air supply port 72. Nitrogen gas generator 52 supplies the nitrogen gas to mass flow controllers 56a2, 56b, and 56c inside gas supply section 50 via first nitrogen supply port 74, second nitrogen supply port 76, and third nitrogen supply port 78 which are provided in power source gas supply unit 16. In this manner, the mass flow controllers 56a2, 56b, 56c can adjust the flow rate while measuring the flow rate of the nitrogen gas supplied from first nitrogen supply port 74, second nitrogen supply port 76, and third nitrogen supply port 78.

Hereinafter, when first air supply port 70 and second air supply port 72 are not distinguished from each other, both of these will be referred to as air supply ports 70 and 72. When first nitrogen supply port 74, second nitrogen supply port 76, and third nitrogen supply port 78 are not distinguished from each other, all of these will be referred to as nitrogen supply ports 74, 76, and 78.

As described above, mass flow controllers 56a1 and 56d measure the flow rate of the gases supplied to air supply ports 70 and 72. In addition, mass flow controllers 56a2, 56b, and 56c measure the flow rate of the gases supplied to nitrogen supply ports 74, 76, and 78.

The air supplied from first air supply port 70 and the nitrogen gas supplied from first nitrogen supply port 74 are supplied as the reaction gas to reaction gas supply port 80 provided in power source gas supply unit 16 via mixer 58 and pressure sensor 62a. In this manner, pressure sensor 62a can measure the pressure of the reaction gas supplied to reaction gas supply port 80.

Furthermore, reaction gas supply port 80 is connected to first flow path port 90 provided in head 14, via tube 60a. In this manner, the reaction gas supplied to reaction gas supply port 80 flows into reaction gas flow path 26 of head 14 via tube 60a and first flow path port 90. Therefore, pressure sensor 62a measures the pressure of the reaction gas supplied to first flow path port 90 of head 14 via first air supply port 70 and first nitrogen supply port 74.

The nitrogen gas supplied from second nitrogen supply port 76 and third nitrogen supply port 78 is supplied as the carrier gas to first carrier gas supply port 82 and second carrier gas supply port 84 which are provided in power source gas supply unit 16 via pressure sensors 62b and 62c.

In this manner, pressure sensors 62b and 62c can measure the pressure of the carrier gas supplied to first carrier gas supply port 82 and second carrier gas supply port 84.

Furthermore, first carrier gas supply port 82 and second carrier gas supply port 84 are connected to second flow path port 92 and third flow path port 94 which are provided in head 14, via tubes 60b and 60c. In this manner, the carrier gas supplied to first carrier gas supply port 82 and second carrier gas supply port 84 flows into the pair of carrier gas flow paths 28 of head 14 via tubes 60b and 60c, second flow path port 92, and third flow path port 94. Therefore, pressure sensors 62b and 62c measure the pressure of the carrier gas supplied to second flow path port 92 and third flow path port 94 of head 14 via second nitrogen supply port 76 and third nitrogen supply port 78.

The air supplied from second air supply port 72 is supplied as the shield gas to shield gas supply port 86 provided in power source gas supply unit 16, via pressure sensor 62d. In this manner, pressure sensor 62d can measure the pressure of the shield gas supplied to shield gas supply port 86.

Furthermore, shield gas supply port 86 is connected to fourth flow path port 96 provided in head 14, via tube 60d. In this manner, the shield gas supplied to shield gas supply port 86 flows into annular space 38 of head 14 via tube 60d and fourth flow path port 96. Therefore, pressure sensor 62d measures the pressure of the shield gas supplied to fourth flow path port 96 of head 14 via second air supply port 72.

Hereinafter, when first flow path port 90, second flow path port 92, third flow path port 94, and fourth flow path port 96 are not distinguished from each other, all of these will be referred to as flow path ports 90, 92, 94, and 96.

Gas Supply Check

In plasma treatment machine 1 of the present embodiment, as described above, the air and the nitrogen gas are supplied to gas supply section 50 of power source gas supply unit 16. However, since a pipe error occurs among compressor 54, nitrogen gas generator 52, and gas supply section 50, when the air is supplied to nitrogen supply ports 74, 76, and 78, or when the nitrogen gas is supplied to air supply ports 70 and 72, pseudo arc A is unstably generated inside head 14, thereby causing a possibility that consumables of head 14 may deteriorate. Therefore, plasma treatment machine 1 of the present embodiment checks supply states of the air and the nitrogen gas in an installation mode performed during setup, for example. Next, this procedure will be described in detail.

Figure 5:
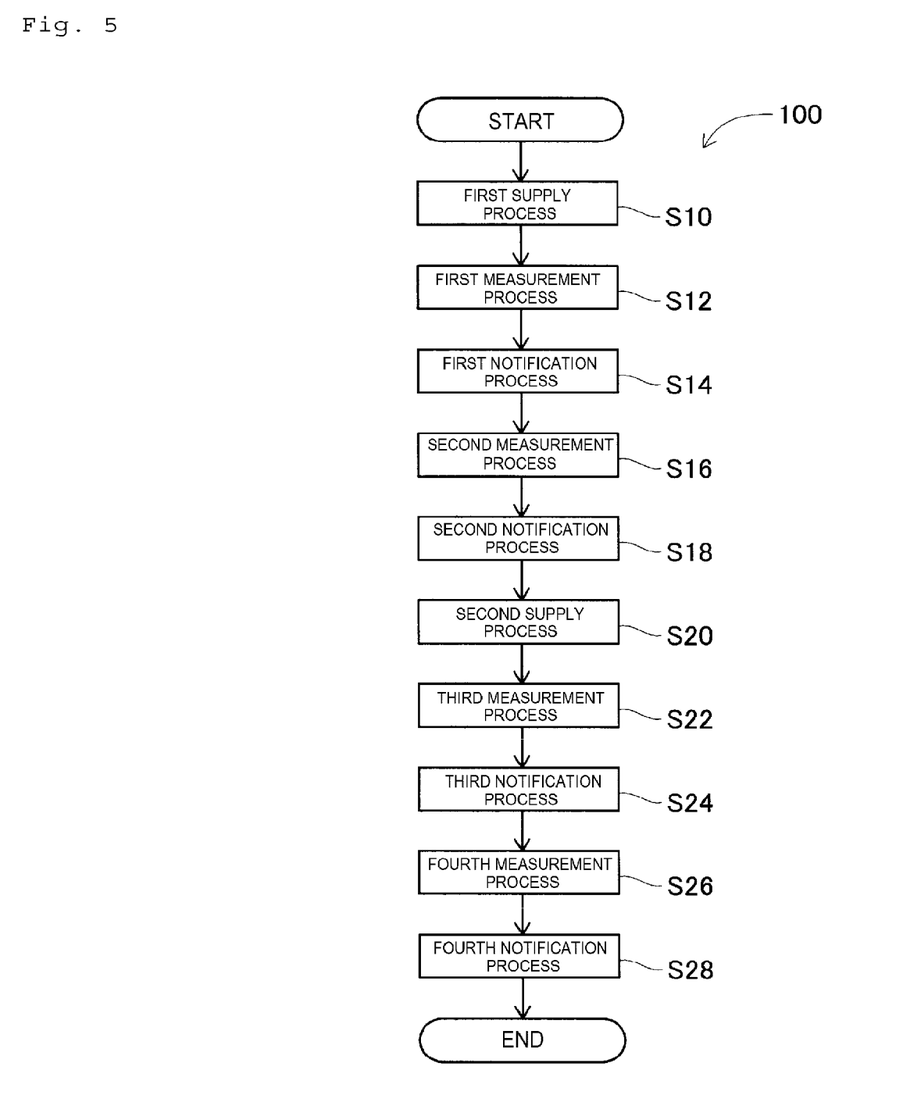
FIG. 5 is a flowchart illustrating a control program of a gas supply determination method.

FIG. 5 is a flowchart illustrating gas supply determination method 100 for checking the supply states of the air and the nitrogen gas. A control program illustrated in a flowchart in FIG. 5 is stored in a ROM of power source gas supply unit 16, and is executed by a CPU of power source gas supply unit 16, when a user performs a predetermined operation on touch panel 17 of power source gas supply unit 16, in the installation mode performed during the setup of plasma treatment machine 1. Therefore, when gas supply determination method 100 is executed, since plasma treatment machine 1 is in a state of the setup, compressor 54, nitrogen gas generator 52, mixer 58, and mass flow controller 56 are not operated. Hereinafter, each process illustrated in the flowchart in FIG. 5 will be described with reference to screen 19 of touch panel 17 illustrated in FIGS. 6 to 9 in addition to FIG. 4 described above.

When gas supply determination method 100 is executed, first supply process S10 is first performed. In this process, compressor 54 and mixer 58 are started, and main valve 57 is opened. In this manner, compressor 54 starts supplying the air.

Subsequently, first measurement process S12 is performed. In this process, mass flow controllers 56a1 and 56d are operated. In this manner, the flow rate is measured by mass flow controllers 56a1 and 56d.

Figure 6:
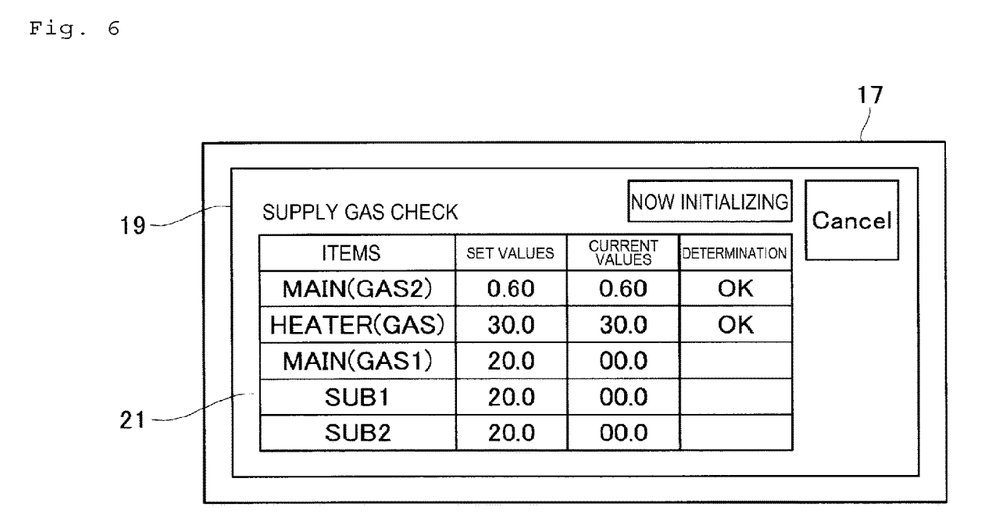
FIG. 6 is a view illustrating a display content of a touch panel.

Subsequently, first notification process S14 is performed. In this process, an air supply state corresponding to a flow rate measurement result of first measurement process S12 described above is displayed on touch panel 17. Specifically, for example, as illustrated in FIG. 6, supply gas check table 21 is displayed on screen 19 of touch panel 17. Supply gas check table 21 has respective columns for items, set values, current values, and determination.

The column for items displays respective characters of MAIN (GAS2), HEATER (GAS), MAIN (GAS1), SUB1, and SUB2 in a state where the characters are aligned in a column direction. The character of MAIN (GAS2) represents the air forming a part of the reaction gas, and indicates the gas whose flow rate is planned to be measured by mass flow controller 56a1 since the gas is supplied to first air supply port 70. The character of HEATER (GAS) represents the air forming all of the shield gas (that is, the heat gas), and indicates the gas whose flow rate is planned to be measured by mass flow controller 56d since the gas is supplied to second air supply port 72. The character of MAIN (GAS1) represents the nitrogen gas forming a part of the reaction gas, and indicates the gas whose flow rate is planned to be measured by mass flow controller 56a2 since the gas is supplied to first nitrogen supply port 74. The character of SUB1 represents the nitrogen gas forming all of the carrier gas, and indicates the gas whose flow rate is planned to be measured by mass flow controller 56b since the gas is supplied to second nitrogen supply port 76. The character of SUB2 represents the nitrogen gas forming all of the carrier gas, and indicates the gas whose flow rate is planned to be measured by mass flow controller 56c since the gas is supplied to third nitrogen supply port 78.

The column for set values displays target values (L/min) in adjusting the flow rate in mass flow controller 56 which are numerical value set for mass flow controller 56, in a state where the target values are aligned in the column direction. Specifically, the respective numerical values of 0.60, 30.0, 20.0, 20.0, and 20.0 are displayed in an associated state with the respective items of MAIN (GAS2), HEATER (GAS), MAIN (GAS1), SUB1, and SUB2.

The column for current values displays flow rate measurement values (L/min) of mass flow controller 56 in a state where the flow rate measurement values are aligned in the column direction. Specifically, the flow rate measurement values of mass flow controllers 56a1, 56d, 56a2, 56b, and 56c are displayed in an associated state with the respective items of MAIN (GAS2), HEATER (GAS), MAIN (GAS1), SUB1, and SUB2.

At this time point, the number of 0.60 which is the flow rate measurement value of mass flow controller 56a1 is displayed in an associated state with the item of MAIN (GAS2). The number of 30.0 which is the flow rate measurement value of mass flow controller 56d is displayed in an associated state with the item of HEATER (GAS). However, since mass flow controllers 56a2, 56b, and 56c are not yet operated, the number of 00.0 is displayed in an associated state with the respective items of MAIN (GAS1), SUB1, and SUB2.

The column for determination displays a check result of the gas supply state by using the character of OK or the character of NG. At this time point, the air is supplied by compressor 54, and further, in mass flow controllers 56a1 and 56d which measure the flow rate of the gas supplied to air supply ports 70 and 72, target values thereof (number of the set values) and the flow rate measurement values (number of the current values) coincide with each other. Therefore, the air is normally supplied to first air supply port 70 and second air supply port 72. Therefore, the column for determination displays the character of OK which indicates that the air is normally supplied to first air supply port 70 and second air supply port 72 in an associated state with the respective items of MAIN (GAS2) and HEATER (GAS).

In contrast, for example, in mass flow controllers 56a1 and 56d which measure the flow rate of the gas supplied to air supply ports 70 and 72, when any one of the flow rate measurement values (number of the current values) is 0 (zero), the air is not supplied to first air supply port 70 or second air supply port 72, and thus, the air is not normally supplied. Therefore, the column for determination displays the character of NG which indicates the fact in an associated state with the corresponding item of MAIN (GAS2) and HEATER (GAS). Thereafter, gas supply determination method 100 ends.

At this time point, nitrogen gas generator 52 does not start supplying the nitrogen gas. Therefore, the column for determination does not display any character for the respective items of MAIN (GAS1), SUB1, and SUB2.

After first notification process S14, second measurement process S16 is performed. In this process, mass flow controllers 56a1 and 56d are stopped, and mass flow controllers 56a2, 56b, and 56c are operated. In this manner, mass flow controllers 56a2, 56b, and 56c measure the flow rate.

Figure 7:
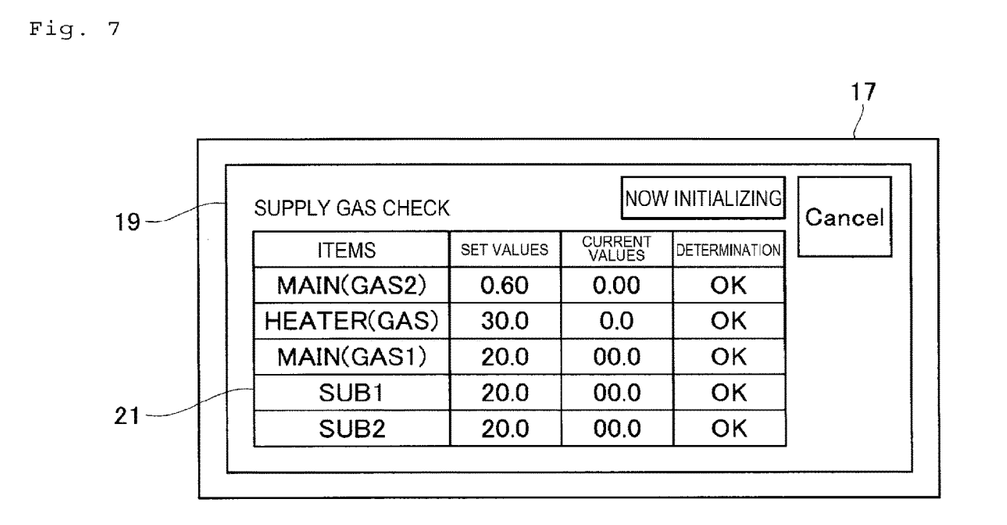
FIG. 7 is a view illustrating a display content of the touch panel.

Subsequently, second notification process S18 is performed. In this process, an air supply state corresponding to a flow rate measurement result of second measurement process S16 described above is displayed on touch panel 17. Specifically, for example, supply gas check table 21 illustrated in FIG. 7 is displayed on screen 19 of touch panel 17. Supply gas check table 21 in FIG. 7 is the same as supply gas check table 21 in FIG. 6 except for points described below.

In supply gas check table 21 in FIG. 7, the column for current values displays the number of 0.00 in an associated state with the item of MAIN (GAS2), and displays the number of 0.0 in an associated state with the item of HEATER (GAS). The reason is that the operation of mass flow controllers 56a1 and 56d is stopped. Therefore, the column for determination displays the character of OK which indicates that mass flow controllers 56a1 and 56d are normal in an associated state with the respective items of MAIN (GAS2) and HEATER (GAS).

Furthermore, in supply gas check table 21 in FIG. 7, the column for current values displays the number of 00.0 in an associated state with the respective items of MAIN (GAS1), SUB1, and SUB2. This indicates that the flow rate measurement value is 00.0 (zero) in mass flow controllers 56a2, 56b, and 56c which measure the flow rate of the gas supplied to nitrogen supply ports 74, 76, and 78. At this time point, since nitrogen gas generator 52 is not yet operated, the nitrogen gas is not supplied, but the air is continuously supplied by compressor 54. Therefore, it is possible to determine that the air is not supplied to first nitrogen supply port 74, second nitrogen supply port 76, and third nitrogen supply port 78.

Therefore, the column for determination displays the character of OK which indicates that the air is not supplied to first nitrogen supply port 74, second nitrogen supply port 76, and third nitrogen supply port 78 in an associated state with respect to the respective items of MAIN (GAS1), SUB1, and SUB2.

In contrast, for example, in mass flow controllers 56a2, 56b, and 56c which measure the flow rate of the gas supplied to nitrogen supply ports 74, 76, and 78, when any one of the flow rate measurement values is greater than 00.0 (zero), the air is supplied to first nitrogen supply port 74, second nitrogen supply port 76, or third nitrogen supply port 78, and the air is not normally supplied. Therefore, the column for determination displays the character of NG which indicates the fact in an associated state with the corresponding item of MAIN (GAS1), SUB1, and SUB2. In addition, in mass flow controllers 56a1 and 56d which have to be in a non-operation state, when any one of the flow rate measurement value is greater than 00.0 (zero), any one of mass flow controller 56a1 and 56d is erroneously operated. Therefore, the column for determination displays the character of NG which indicates the fact in an associated state with the corresponding item of MAIN (GAS2) and HEATER (GAS). Thereafter, gas supply determination method 100 ends.

After second notification process S18 described above, second supply process S20 is performed. In this process, nitrogen gas generator 52 is started. In this manner, nitrogen gas generator 52 starts supplying the nitrogen gas.

Subsequently, third measurement process S22 is performed. In this process, mass flow controllers 56a2, 56b, and 56c measure the flow rate.

Figure 8:
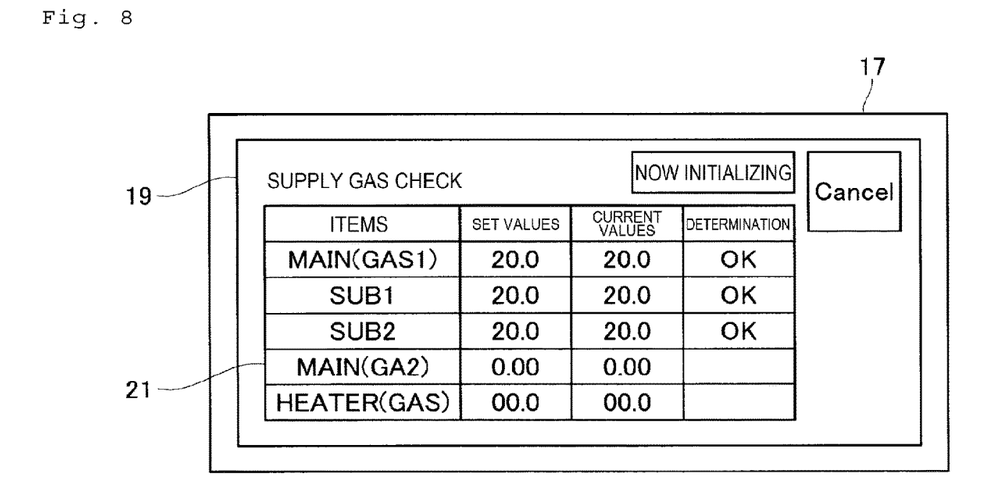
FIG. 8 is a view illustrating a display content of the touch panel.

Subsequently, third notification process S24 is performed. In this process, a nitrogen gas supply state corresponding to a flow rate measurement result of third measurement process S22 described above is displayed on touch panel 17. Specifically, for example, supply gas check table 21 illustrated in FIG. 8 is displayed on screen 19 of touch panel 17. Supply gas check table 21 in FIG. 8 is the same as supply gas check table 21 in FIG. 6 except for points described below.

In supply gas check table 21 in FIG. 8, the respective columns for items display the characters or the numbers in a state where the characters or the numbers are realigned in the order of MAIN (GAS1), SUB1, SUB2, MAIN (GAS2), and HEATER (GAS). At this time point, in first air supply port 70 and second air supply port 72, the air is normally supplied, and it is previously recognized that the nitrogen gas is not supplied. Therefore, the respective columns for set values and current values display the number of 0.00 in an associated state with the item of MAIN (GAS2). Furthermore, the respective columns for set values and current values display the number of 00.0 in an associated state with the item of HEATER (GAS). The column for determination does not display the respective items of MAIN (GAS2) and HEATER (GAS).

Furthermore, in supply gas check table 21 in FIG. 8, the column for current values displays the number of 20.0 in an associated state with the respective items of MAIN (GAS1), SUB1, and SUB2. This indicates that the flow rate measurement value of mass flow controllers 56a2, 56b, and 56c is 20.0. That is, at this time point, in mass flow controllers 56a2, 56b, and 56c which measure the flow rate of the gas supplied to nitrogen supply ports 74, 76, and 78, the target values (number of the set values) and the flow rate measurement values (number of the current values) coincide with each other. In addition, although compressor 54 and nitrogen gas generator 52 are in operation, it is previously recognized that the air is normally supplied by compressor 54. Therefore, it is possible to determine that the nitrogen gas is normally supplied in first nitrogen supply port 74, second nitrogen supply port 76, and third nitrogen supply port 78.

Therefore, the column for determination displays the character of OK which indicates that the nitrogen gas is normally supplied to first nitrogen supply port 74, second nitrogen supply port 76, and third nitrogen supply port 78 in an associated state with the respective items of MAIN (GAS1), SUB1, and SUB2

In contrast, for example, in mass flow controllers 56a2, 56b, and 56c which measure the flow rate of the gas supplied to nitrogen supply ports 74, 76, and 78, when any one of the flow rate measurement values is 0 (zero), the nitrogen gas is not supplied in first nitrogen supply port 74, second nitrogen supply port 76, or third nitrogen supply port 78, and the nitrogen gas is not normally supplied. Therefore, the column for determination displays the character of NG which indicates the fact in an associated state with the corresponding item of MAIN (GAS1), SUB1, and SUB2. Thereafter, gas supply determination method 100 ends.

After third notification process S24, fourth measurement process S26 is performed. In this process, after the operation of mass flow controllers 56a1 and 56d re-starts, pressure sensor 62 measures the pressure.

Figure 9:
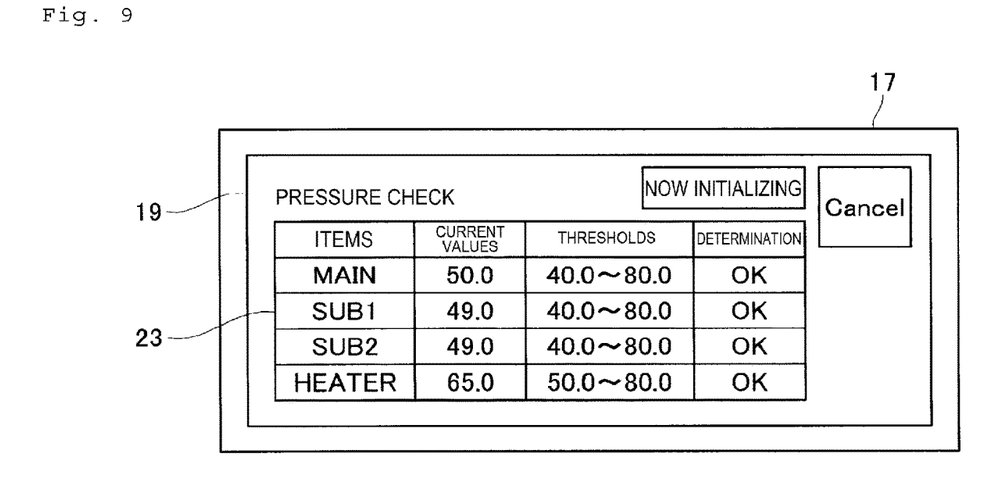
FIG. 9 is a view illustrating a display content of the touch panel.

Subsequently, fourth notification process S28 is performed. In this process, a gas pressure state corresponding to a pressure measurement result of fourth measurement process S26 is displayed on touch panel 17. Specifically, for example, as illustrated in FIG. 9, pressure check table 23 is displayed on screen 19 of touch panel 17. Pressure check table 23 has the columns for items, current values, thresholds, and determination.

The column for items displays the respective characters of MAIN, SUB1, SUB2, and HEATER in a state where the respective characters are aligned in the column direction. The character of MAIN represents the reaction gas ($N_2+O_2$), and indicates the gas that is planned to be supplied to first flow path port 90 of head 14 after the pressure is measured by pressure sensor 62a. The character of SUB1 represents the carrier gas ($N_2$), and indicates the gas that is planned to be supplied to second flow path port 92 of head 14 after the pressure is measured by pressure sensor 62b. The character of SUB2 represents the carrier gas ($N_2$), and indicates the gas that is planned to be supplied to third flow path port 94 of head 14 after the pressure is measured by pressure sensor 62c. The character of HEATER represents the shield gas (that is, the heat gas) (Air), and indicates the gas that is planned to be supplied to fourth flow path port 96 of head 14 after the pressure is measured by pressure sensor 62d.

The column for current values displays pressure measurement values (kPa) of pressure sensor 62 in a state where the pressure measurement values are aligned in the column direction. Specifically, the pressure measurement values of pressure sensors 62a, 62b, 62c, and 62d are displayed in an associated state with the respective items of MAIN, SUB1, SUB2, and HEATER.

At this time point, the number of 50.0 which is the pressure measurement value of pressure sensor 62a is displayed in an associated state with the item of MAIN. The number of 49.0 which is the pressure measurement value of pressure sensors 62b and 62c is displayed in an associated state with the items of SUB1 and SUB2. The number of 65.0 which is the pressure measurement value of pressure sensor 62d is displayed in an associated state with the item of HEATER.

The column for thresholds displays a range of the pressure values (kPa) which indicates that the gas pressure is normal in a state where the pressure values are aligned in the column direction. Specifically, the numbers of (indicating a range of) 40.0 to 80.0 are displayed in an associated state with the respective items of MAIN, SUB1, and SUB2. In addition, the numbers of (indicating a range of) 50.0 to 80.0 are displayed in an associated state with the item of HEATER.

The column for determination displays a check result of the gas pressure state by using the character of OK or NG. At this time point, in pressure sensor 62a, 62b, 62c, and 62d which measure the pressure of the gas supplied to flow path ports 90, 92, 94, and 96 of head 14, the pressure measurement values (number of the current values) fall within a range displayed by the numbers in the column for thresholds. Therefore, it is possible to determine that the pressure of the supply gas is normal in first flow path port 90, second flow path port 92, third flow path port 94, and fourth flow path port 96. Therefore, the column for determination displays the character of OK which indicates that the pressure of the supply gas is normal in first flow path port 90, second flow path port 92, third flow path port 94, and fourth flow path port 96 in an associated state with the respective items of MAIN, SUB1, SUB2 and HEATER.

In contrast, for example, in pressure sensor 62a, 62b, 62c, and 62d which measure the pressure of the gas supplied to flow path ports 90, 92, 94, and 96 of head 14, when any one of the pressure measurement values (number of the current values) falls out of a range displayed by the numbers in the column for thresholds, the pressure of the supply gas is abnormal in first flow path port 90, second flow path port 92, third flow path port 94, or fourth flow path port 96. Therefore, the column for determination displays the character of NG which indicates the fact in an associated state with the corresponding items of MAIN, SUB1, SUB2, and HEATER. Thereafter, gas supply determination method 100 ends.

As described above in detail, according to gas supply determination method 100 executed in plasma treatment machine 1 of the present embodiment, the supply state of the nitrogen gas supplied by nitrogen gas generator 52 connected to compressor 54 is checked in addition to the check of the supply state of the air supplied by compressor 54.

The present disclosure is not limited to the above-described embodiment, and various modifications can be made within the scope not departing from the concept of the present disclosure. For example, gas supply determination method 100 is executed in an installation mode performed during setup of plasma treatment machine 1, but may be executed at any desired time in addition to the setup.

In addition, in gas supply determination method 100, mass flow controller 56 may measure the flow rate or may open and close the flow path by using another mass flow meter separate from the mass flow controller 56 or an on-off valve.

Incidentally, in the present embodiment, plasma treatment machine 1 is an example of a plasma generator. Power source gas supply unit 16 is an example of a control device. Touch panel 17 is an example of a notification device. Nitrogen gas generator 52 is an example of a second supply device. Compressor 54 is an example of a first supply device. Mass flow controllers 56a1 and 56d are examples of first flow rate measurement devices. Mass flow controllers 56a2, 56b, and 56c are examples of second flow rate measurement devices. Air supply ports 70 and 72 are examples of first supply ports. Nitrogen supply ports 74, 76, and 78 are examples of second supply ports. Flow path ports 90 and 96 are examples of third supply ports. Flow path ports 90, 92, and 94 are examples of fourth supply ports. First supply process S10 is an example of a first supply step.

First measurement process S12 is an example of a first measurement step. First notification process S14 is an example of a first notification step. Second measurement process S16 is an example of a second measurement step. Second notification process S18 is an example of a second notification step. Second supply process S20 is an example of a second supply step. Third measurement process S22 is an example of a third measurement step. Third notification process S24 is an example of a third notification step. Fourth measurement process S26 is an example of a fourth measurement step. Fourth notification process S28 is an example of a fourth notification step.

REFERENCE SIGNS LIST 1 plasma treatment machine, 14 plasma head, 16 power source gas supply unit, 17 touch panel, 52 nitrogen gas generator, 54 compressor, 56a1, 56d mass flow controller, 56a2, 56b, 56c mass flow controller, 70 first air supply port, 72 second air supply port, 74 first nitrogen supply port, 76 second nitrogen supply port, 78 third nitrogen supply port, 90 first flow path port, 92 second flow path port, 94 third flow path port, 96 fourth flow path port, 100 gas supply determination method, S10 first supply process, S12 first measurement process, S14 first notification process, S16 second measurement process, S18 second notification process, S20 second supply process, S22 third measurement process, S24 third notification process, S26 fourth measurement process, S28 fourth notification process

The invention claimed is:

1. A gas supply determination method in a plasma generator having a first supply port, a second supply port, and a plasma head having a third supply port to which gas is supplied via the first supply port and a fourth supply port to which gas is supplied via the second supply port, in which the plasma generator includes:
a first supply device for supplying a first gas from the first supply port, the first supply device being a compressor which supplies the first gas via a first output of the compressor; and
a second supply device for supplying a second gas from the second supply port, the second supply device being a nitrogen gas generator having an input that is connected to a second output of the compressor parallel to the first output of the compressor, the nitrogen gas generator supplies the second gas from an output of the nitrogen gas generator so that the second gas is separated from the first gas supplied from the compressor,
the gas supply determination method comprising:
a first supply step of causing the first supply device to start supplying the first gas in a state where the second supply device stops supplying the second gas;
a first measurement step of measuring a flow rate of the gas supplied to the first supply port after the first supply step;
a first notification step of notifying a supply state of the first gas in the first supply port in accordance with a flow rate measurement result of the first measurement step;
a second measurement step of measuring a flow rate of the gas supplied to the second supply port after the first supply step;
a second notification step of notifying a supply state of the first gas in the second supply port in accordance with a flow rate measurement result of the second measurement step;
a second supply step of causing the second supply device to start supplying the second gas after the second notification step;
a third measurement step of measuring a flow rate of the gas supplied to the second supply port after the second supply step;
a third notification step of notifying a supply state of the second gas in the second supply port in accordance with a flow rate measurement result of the third measurement step:
a fourth measurement step of measuring a pressure of the gas supplied to the third supply port and measuring a pressure of the gas supplied to the fourth supply port after the second supply step; and
a fourth notification step of notifying a supply state of the gas supplied to the plasma head in accordance with a pressure measurement result of the fourth measurement step.

2. The gas supply determination method according to claim 1, wherein the first gas is air and the second gas is nitrogen.

3. The gas supply determination method according to claim 2, wherein the first supply port includes a first air supply port and a second air supply port, and the second supply port includes a first nitrogen supply port, a second nitrogen supply port, and a third nitrogen supply port.

4. The gas supply determination method according to claim 3, wherein a mixer is provided at a downstream end of the first air supply port and a downstream end of the first nitrogen supply port, the mixer being configured to mix the air and the nitrogen to generate a reaction gas.

5. A plasma treatment machine comprising:
a plasma generator having a first supply port and a second supply port, and
a plasma head having a third supply port to which gas is supplied via the first supply port and a fourth supply port to which gas is supplied via the second supply port,
the plasma generator comprising:
a first supply device configured to supply a first gas from the first supply port, the first supply device being a compressor configured to supply the first gas via a first output of the compressor;
a second supply device which is configured to supply a second gas from the second supply port, the second supply device being a nitrogen gas generator having an input that is connected to a second output of the compressor parallel to the first output of the compressor, the nitrogen gas generator configured to supply the second gas from an output of the nitrogen gas generator so that the second gas is separated from the first gas supplied from the compressor;
a first flow rate measurement device configured to measure a flow rate of the gas supplied to the first supply port;
a second flow rate measurement device configured to measure a flow rate of the gas supplied to the second supply port;
a notification device configured to notify a supply state of the first gas or the second gas; and
a control device,
wherein the control device performs
a first supply process of causing the first supply device to start supplying the first gas in a state where the second supply device stops supplying the second gas,
a first measurement process of causing the first flow rate measurement device to measure a flow rate after the first supply process, a first notification process of causing the notification device to notify a supply state of the first gas in the first supply port in accordance with a flow rate measurement result of the first measurement process, a second measurement process of causing the second flow rate measurement device to measure a flow rate after the first supply process, a second notification process of causing the notification device to notify a supply state of the first gas in the second supply port in accordance with a flow rate measurement result of the second measurement process, a second supply process of causing the second supply device to start supplying the second gas after the second notification process, a third measurement process of causing the second flow rate measurement device to measure a flow rate after the second supply process, a third notification process of causing the notification device to notify a supply state of the second gas in the second supply port in accordance with a flow rate measurement result of the third measurement process, a fourth measurement step of measuring a pressure of the gas supplied to the third supply port and measuring a pressure of the gas supplied to the fourth supply port after the second supply step, and a fourth notification step of notifying a supply state of the gas supplied to the plasma head in accordance with a pressure measurement result of the fourth measurement step.

6. The plasma treatment machine according to claim 5, wherein the first gas is air and the second gas is nitrogen, and wherein the first supply port includes a first air supply port and a second air supply port, and the second supply port includes a first nitrogen supply port, a second nitrogen supply port, and a third nitrogen supply port.

7. The plasma treatment machine according to claim 6, wherein a mixer is provided at a downstream end of the first air supply port and a downstream end of the first nitrogen supply port, the mixer being configured to mix the air and the nitrogen to generate a reaction gas.

* * * * *